United States Patent
Kim et al.

(10) Patent No.: US 10,153,159 B1
(45) Date of Patent: Dec. 11, 2018

(54) SOURCE AND DRAIN FORMATION USING SELF-ALIGNED PROCESSES

(71) Applicant: International Business Machines Corporation, Armonk, NY (US)

(72) Inventors: Seyoung Kim, White Plains, NY (US); Yun Seog Lee, Seoul (KR); Devendra Sadana, Pleasantville, NY (US); Joel de Souza, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/827,108

(22) Filed: Nov. 30, 2017

(51) Int. Cl.
| | |
|---|---|
| H01L 21/02 | (2006.01) |
| H01L 29/20 | (2006.01) |
| H01L 29/66 | (2006.01) |
| H01L 29/08 | (2006.01) |
| H01L 29/227 | (2006.01) |
| H01L 29/267 | (2006.01) |
| H01L 21/306 | (2006.01) |
| H01L 29/78 | (2006.01) |

(52) U.S. Cl.
CPC .... *H01L 21/02642* (2013.01); *H01L 21/0257* (2013.01); *H01L 21/0262* (2013.01); *H01L 21/02554* (2013.01); *H01L 21/30621* (2013.01); *H01L 29/0847* (2013.01); *H01L 29/20* (2013.01); *H01L 29/227* (2013.01); *H01L 29/267* (2013.01); *H01L 29/66462* (2013.01); *H01L 29/66522* (2013.01); *H01L 29/78* (2013.01)

(58) Field of Classification Search
CPC .......... H01L 29/1606; H01L 29/66583; H01L 29/66515; H01L 2924/13088

USPC ................................................ 438/142, 229
See application file for complete search history.

(56) References Cited

U.S. PATENT DOCUMENTS

| | | | |
|---|---|---|---|
| 7,824,972 B2 | 11/2010 | Choung et al. | |
| 8,207,530 B2 | 6/2012 | Kim et al. | |
| 8,378,404 B2 | 2/2013 | Chen | |
| 9,059,043 B1 | 6/2015 | Leobandung et al. | |
| 9,472,640 B2 | 10/2016 | Guo et al. | |
| 9,859,424 B2 * | 1/2018 | Glass | B82Y 10/00 |
| 2008/0093595 A1 | 4/2008 | Song et al. | |

(Continued)

FOREIGN PATENT DOCUMENTS

| | | | |
|---|---|---|---|
| CN | 101183667 A | 5/2008 | |
| JP | 06291318 A | 10/1994 | |

(Continued)

*Primary Examiner* — David Vu
*Assistant Examiner* — Brandon Fox
(74) *Attorney, Agent, or Firm* — Alexander G. Jochym

(57) ABSTRACT

An approach to deposit, by a self-aligning process, a layer of graphene on a gate formed on a dielectric layer on a semiconductor substrate where the gate includes a metal catalyst material. The approach includes removing a portion of the dielectric layer and a portion of the semiconductor substrate not under the gate and depositing, by a self-aligning atomic layer deposition process, a layer of a material capable of creating a source and a drain in a semiconductor device on exposed surfaces of the semiconductor substrate and the dielectric layer. The approach includes removing the layer of graphene from the gate, and, then removing a portion of the layer of the material capable of creating the source and the drain in the semiconductor device.

7 Claims, 6 Drawing Sheets

(56) References Cited

U.S. PATENT DOCUMENTS

| | | |
|---|---|---|
| 2008/0277663 A1 | 11/2008 | Kang et al. |
| 2011/0003453 A1 | 1/2011 | Jang |
| 2013/0075717 A1 | 3/2013 | Tsang |
| 2015/0364567 A1* | 12/2015 | Feng ................ H01L 29/42364 438/151 |
| 2016/0104778 A1* | 4/2016 | Wolff ................ H01L 29/66037 257/29 |
| 2016/0336408 A1 | 11/2016 | de Souza et al. |

FOREIGN PATENT DOCUMENTS

| | | |
|---|---|---|
| JP | 2009088179 A | 4/2009 |
| JP | 2013172031 A | 9/2013 |

* cited by examiner

SOURCE AND DRAIN FORMATION USING SELF-ALIGNED PROCESSES

BACKGROUND OF THE INVENTION

The present invention relates generally to the field of semiconductor technology, and more particularly to a method of creating a semiconductor device using graphene for self-aligning deposition processes.

A crystalline allotrope of carbon, graphene is formed by a honeycomb or hexagonal structure of a layer of carbon atoms. Graphene has many unique electrical, optical, and mechanical properties that make graphene one of the most studied materials for semiconductor devices in recent years. The unique properties of graphene provide numerous opportunities for potential applications in semiconductor device manufacturing.

Graphene provides the highest room temperature electrical conductivity of any known substance while also providing superior mechanical properties for semiconductor device manufacture. The graphene lattice structure provides a tensile strength of 130 giga Pascal and is stronger than structural steel and Kevlar®. Additionally, graphene in a single atomic layer is conformal and drapes over semiconductor device features such as gates. The ability of graphene to conform to various semiconductor device features is especially advantageous for the formation of nanometer-scale semiconductor devices commonly using three-dimensional structures. Typically, graphene is deposited on a metal foil or carrier using a deposition process such as chemical vapor deposition. The graphene layer or layers can be transferred to a target substrate such as a semiconductor substrate. In some cases, graphene is deposited directly on a substrate with a metal or metal catalyst as a growth surface by chemical vapor deposition. Graphene provides a chemically inert surface that is resistant to many of the processes that etch silicon and other semiconductor materials. Additionally, graphene can be used as a mask for various deposition processes, such as atomic layer deposition, in semiconductor device manufacture due in part to the ability of graphene to conform to various semiconductor device features while providing a chemically inert surface resistant to material deposition.

SUMMARY

Embodiments of the present invention provide a method to deposit, by a self-aligning process, a layer of graphene on a gate formed on a dielectric layer on a semiconductor substrate where the gate includes a metal catalyst material. The method includes removing a portion of the dielectric layer and a portion of the semiconductor substrate not under the gate and depositing, by a self-aligning atomic layer deposition process, a layer of a material capable of creating a source and a drain in a semiconductor device on exposed surfaces of the semiconductor substrate and the dielectric layer. The method includes removing the layer of graphene from the gate, and, then removing a portion of the layer of the material capable of creating the source and the drain in the semiconductor device.

DETAILED DESCRIPTION

Figure 1:
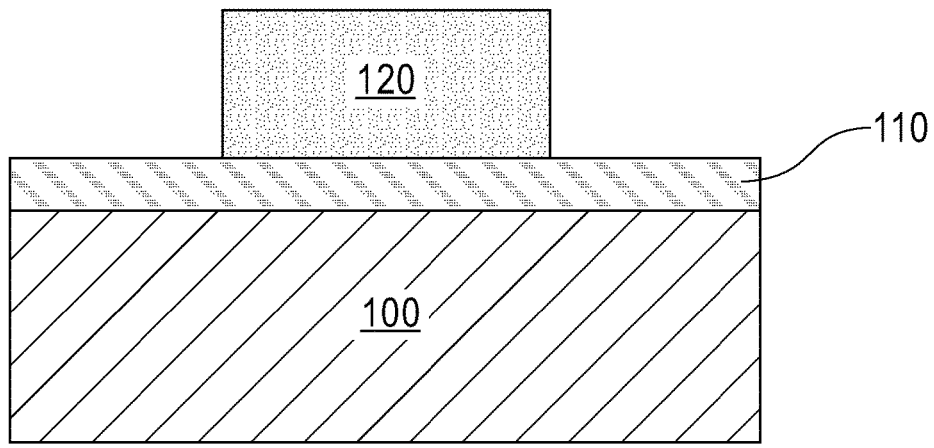
FIG. 1 depicts a cross-sectional view of a semiconductor substrate after fabrication steps to form a gate on a dielectric layer in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper," "lower", "right", "left", "vertical", "horizontal", "top", "bottom", and derivatives thereof shall relate to the disclosed structures and methods, as oriented in the drawing figures. The terms "overlying," "atop," "over," "on," "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be described. It should be understood that the following description is rather focused on the distinctive features or elements of the various embodiments of the present invention.

Embodiments of the present invention recognize that increasing circuit density in semiconductor devices may require the use of new materials and processes to provide reduced circuit features and feature spacing. Embodiments of the present invention recognize the importance of alignment of circuit features during circuit feature deposition in nano-scale, semiconductor device fabrication.

Embodiments of the present invention propose the use of graphene as a mask during a self-aligned deposition process of a source/drain material in a semiconductor device. Embodiments of the present invention provide a method to create a high performance microelectronic device such as a metal-oxide semiconductor field-effect transistor (MOSFET). Embodiments of the present invention include the use of a source/drain material for the MOSFET, such as an aluminum-doped zinc oxide (AZO), deposited by atomic layer deposition to form a low-leakage hetrojunction with a semiconductor substrate. Embodiments of the present invention include a method to provide one or more self-aligned deposition processes such as a self-aligned source/drain material deposition and a self-aligned graphene deposition. The ability to provide one or more self-aligned processes associated with the source/drain material deposition will be advantageous for reliable device manufacturing processes in nanometer-scale semiconductor devices.

FIG. 1 depicts a cross-sectional view of semiconductor substrate 100 after fabrication steps to form gate 120 on dielectric layer 110 in accordance with an embodiment of the present invention. As depicted, FIG. 1 includes semiconductor substrate 100, dielectric layer 110, and gate 120. Gate 120 is formed on dielectric layer 110 on semiconductor substrate 100.

Semiconductor substrate 100 may be composed of any semiconductor material. In various embodiments, semiconductor substrate 100 is a wafer or a portion of a wafer. In various embodiments, semiconductor substrate 100 is composed of one of any group III-V semiconductor material, group II-VI semiconductor material, or group IV semiconductor material. In some embodiments, semiconductor substrate 100 is composed of an InGaAs semiconductor material. For example, $In_{0.53}Ga_{0.47}As$ and other similar alloys of InGaAs compose semiconductor substrate 100. In various embodiments, semiconductor substrate 100 composed of a material, such as InGaAs, that is defect-rich. In other examples, semiconductor substrate 100 may be composed of materials including, for example, Si, SiGe, SiGeC, SiC, Ge, GaAs, InAs, InP, or other III-V compound semiconductor materials, or HgTe, CdTe, HgCdTe, or other II-VI compound semiconductor materials or alloys of GaAlAs, InGaAs, InAlAs, InAlAsSb, InAlAsP, and InGaAsP. In some embodiments, semiconductor substrate 100 is one of doped, undoped, or contains doped or undoped regions. In an embodiment, semiconductor substrate 100 is a layered semiconductor substrate such as a semiconductor-on-insulator substrate (SOI).

Dielectric layer 110 is formed or deposited on semiconductor substrate 100. Dielectric layer 110 may be composed of any suitable dielectric material deposited by known methods such as chemical vapor deposition (CVD), atomic layer deposition (ALD), physical vapor deposition (PVD), or other appropriate dielectric material deposition process. In various embodiments, dielectric layer 110 is composed of a high dielectric constant material or a high-k dielectric material. For example, dielectric 110 may be composed of $HfO_2$, $ZrO_2$, $Al_2O_3$, $TiO_2$, $LaAlO_3$, $HfSiO_2$, $SrTiO_3$, $Y_2O_3$, or other similar dielectric materials with a high dielectric constant (e.g., greater than 4). In various embodiments, dielectric layer 110 thickness may be in the range 1 nm to 20 μm however, the thickness of dielectric layer 110 is not limited to this thickness range but, may be less than 1 nm or more than 20 μm.

In various embodiments, gate 120 is composed any known gate material for semiconductor devices that includes a metal catalyst capable of providing a surface for deposition of graphene. For example, gate 120 surface may be composed of any gate material containing Cu, Ni, Fe, or other similar metal used in a semiconductor device gate capable if acting as a catalyst in later graphene deposition on gate 120. Gate 120 is deposited and formed by known semiconductor manufacture processes including gate 120 deposition techniques such as atomic layer deposition (ALD), chemical vapor deposition (CVD), physical vapor deposition (PVD), molecular beam epitaxy (MBE), and may use wet or dry etch processes such as reactive ion etch or the like for gate 120 formation. In various embodiments, gate 120 thickness ranges from several nanometers to a hundred nanometers although gate 120 may be more than this thickness.

Figure 2:
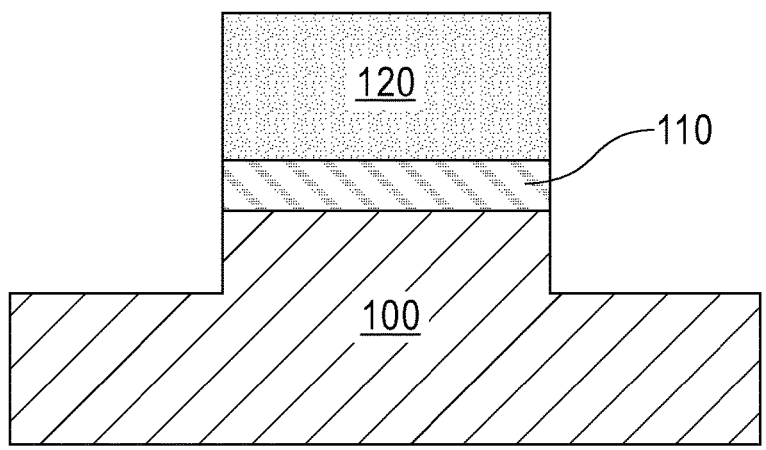
FIG. 2 depicts a cross-sectional view of the semiconductor substrate after fabrication steps to remove a portion of the dielectric layer and partially removing a top portion of the semiconductor substrate in accordance with an embodiment of the present invention.

FIG. 2 depicts a cross-sectional view of semiconductor substrate 100 after fabrication steps to remove a portion of dielectric layer 110 and partially removing a top portion of semiconductor substrate 100 in accordance with an embodiment of the present invention. As depicted in FIG. 2, after partially removing the top portion of semiconductor substrate 100 under the removed portion of dielectric layer 110, a portion of semiconductor substrate 100 remains under the removed portion of semiconductor substrate 100. The removal of the portion of dielectric layer 110 not covered by gate 120 and partially removing the top portion of semiconductor substrate 100 not under gate 120 occurs by one or more known wet or dry etching processes. For example, the portion of dielectric layer 110 not covered by gate 120 may be removed or etched using lithography processes and a wet chemical etch while the part of semiconductor substrate 100 under the removed dielectric layer 110 may be removed using a reactive ion etch (RIE). In another example, both dielectric layer 110 and a part of semiconductor substrate 100 are removed using lithography processes and a chemical etch or by RIE.

Figure 3:
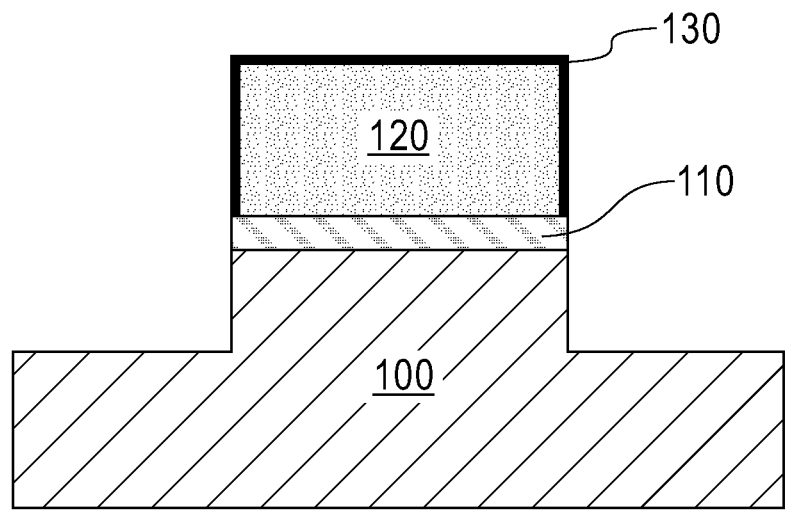
FIG. 3 depicts a cross-sectional view of the semiconductor substrate after fabrication steps for a self-aligned deposition of a layer of graphene on the gate in accordance with an embodiment of the present invention.

FIG. 3 depicts a cross-sectional view of semiconductor substrate 100 after fabrication steps for a self-aligned deposition of a layer of graphene layer 130 on gate 120 in accordance with an embodiment of the present invention. In various embodiments, the layer of graphene layer 130 is deposited on gate 120 using a CVD process. The deposition of graphene layer 130 on gate 120 can occur using any one of known CVD processes. For example, graphene layer 130 can be deposited on gate 120 by plasma enhanced CVD (PECVD), low pressure CVD (LPCVD), high vacuum CVD (HVCVD), or other suitable CVD process. In one embodiment, graphene layer 130 is deposited by a CVD process at temperatures ranging from 800 to 2500 degrees Celsius using one of various carbon containing gases or sources such as benzene, propane, ethane, other hydrocarbons, or other carbon containing gases. In various embodiments, graphene layer 130 is a continuous monolayer or a carbon film composed of a single carbon molecule thickness s i.e., a film or layer approximately 0.34 nm thick of a single molecular layer of carbon atoms) providing a continuous coverage of gate 120 (e.g., no holes or openings in the graphene layer). In some embodiments, graphene layer 130 is composed of multiple molecular layers of carbon atoms (i.e., two or more layers of carbon atoms deposited on gate 120) providing a continuous or complete coverage of gate 120.

The deposition of graphene layer 130 on gate 120 is a self-aligning deposition process. CVD deposition of graphene layer 130 requires a metal catalyst present in a growth surface such as gate 120. Exposed surfaces of dielectric layer 110 and semiconductor substrate 100 do not provide a surface with a metal catalyst for graphene deposition by a CVD process. Gate 120, composed of or including a metal catalyst material required for graphene deposition by CVD, provides a suitable surface for graphene layer 130 deposition. Therefore, graphene layer 130 deposits in a self-aligned CVD deposition processes on the surface of metal catalyst containing gate 120 and covers both the top surface of gate 120 and the exposed sides of gate 120.

Figure 4:
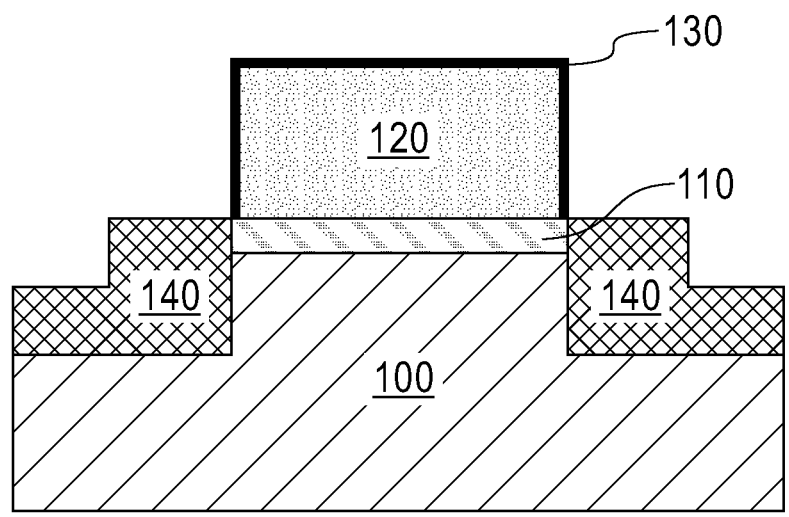
FIG. 4 depicts a cross-sectional view of the semiconductor substrate after fabrication steps for a self-aligned atomic layer deposition of an oxide on the semiconductor substrate for a semiconductor device source and drain in accordance with an embodiment of the present invention.

FIG. 4 depicts a cross-sectional view of semiconductor substrate 100 after fabrication steps for a self-aligned ALD of source/drain material 140 on semiconductor substrate 100 for a semiconductor device source and drain in accordance with an embodiment of the present invention. Graphene layer 130 provides chemically inert surface that can be used as a mask for ALD as nucleation of ALD films on a chemically inert graphene surface does not occur. For this reason, graphene layer 130 acts as deposition mask for ALD of source/drain material 140 to selectively deposit source/drain material 140 on semiconductor substrate 100 and along the edges of dielectric layer 110 and not on graphene layer 130 covering gate 120. Therefore, selective or self-aligned deposition of source/drain material 140 does not occur on gate 120. In an embodiment, source/drain material 140 is deposited along the edges of dielectric layer 110 across the top surface or a portion of the top surface of semiconductor substrate 100. In some embodiments, source/drain material 140 is deposited in a recessed area in semiconductor substrate 100. In various embodiments, source/drain material 140 is composed of any material capable of becoming a source and a drain in a semiconductor device. For example, source/drain material 140 is a material such as zinc oxide doped with aluminum or other similar oxide material. In an embodiment, a range of aluminum used for doping zinc oxide is 0.1 atomic percent to 10 atomic percent, although the range of zinc dopant is not limited to this range for the aluminum doped zinc oxide material (e.g., AZO) used for source/drain material 140 in other embodiments. In an embodiment, source/drain material 140 is not doped. In some embodiments, source/drain material 140 is doped with another dopant for another suitable source/drain material for a MOSFET. Other examples of materials for capable of being deposited as source/drain material 140 on semiconductor substrate 100 by ALD for a source or a drain in a MOSFET semiconductor device include at least: titanium-doped zinc oxide, and gallium-doped zinc oxide.

Figure 5:
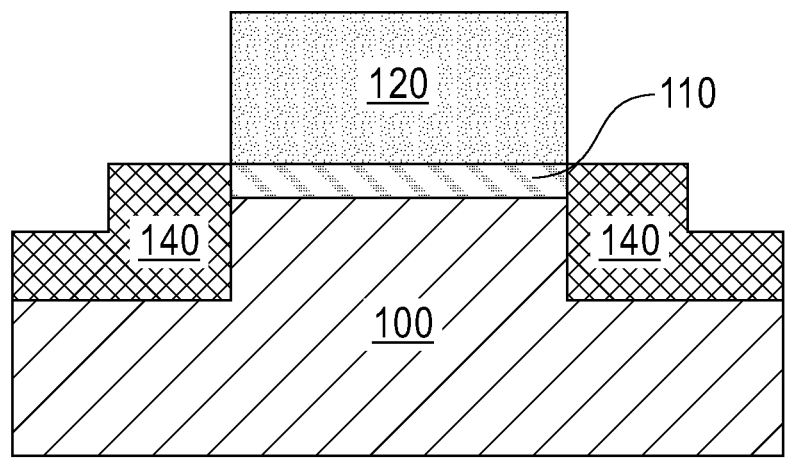
FIG. 5 depicts a cross-sectional view of the semiconductor substrate after fabrication steps to remove the graphene layer from the gate in accordance with an embodiment of the present invention.

FIG. 5 depicts a cross-sectional view of semiconductor substrate 100 after fabrication steps to remove graphene layer 130 from gate 120 in accordance with an embodiment of the present invention. In various embodiments, graphene layer 130 is removed from gate 120 using known wet or a dry etching processes capable of removing graphene without damaging gate 120, dielectric layer 110, or semiconductor substrate 100. For example, an oxygen plasma process removes graphene layer 130 from gate 120.

Figure 6:
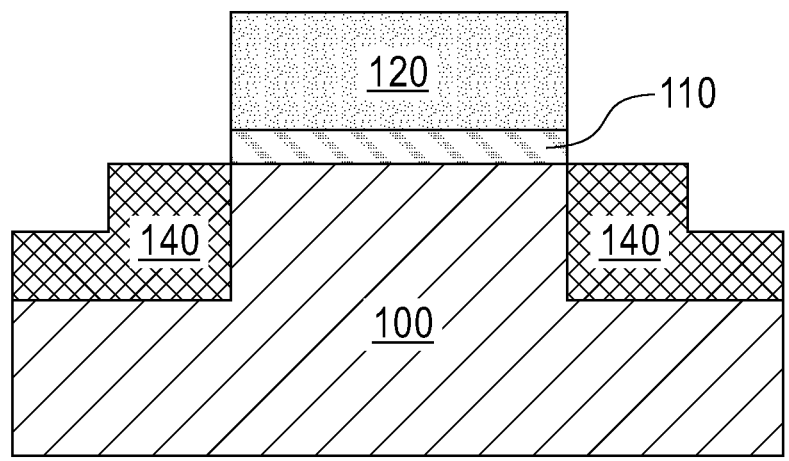
FIG. 6 depicts a cross-sectional view of the semiconductor substrate after fabrication steps to remove a portion of the oxide above the semiconductor substrate to form the semiconductor device source and drain in accordance with an embodiment of the present invention.

FIG. 6 depicts a cross-sectional view of semiconductor substrate 100 after fabrication steps to remove a portion of source/drain material 140 above a portion semiconductor substrate 100 to form a source and a drain in accordance with an embodiment of the present invention. In various embodiments, source/drain material 140 is etched to a level below the top surface of dielectric layer 110 and above the bottom surface of dielectric layer 110. In an embodiment, source/drain material 140 is etched down below the bottom surface of dielectric layer 110. Source/drain material 140 can be etched by any known methods of etching a material for a source and drain in a semiconductor device such as a MOSFET. For example, a RIE etch of source/drain material 140 can be used to obtain a desired thickness of source/drain material 140. In another example, a wet, chemical etch of source/drain material 140 can be performed using standard lithography and etch processes.

Upon completion of source/drain material 140 etch, a semiconductor device (e.g., a MOSFET) can be completed using standard semiconductor manufacturing processes. For example, metal contact formation, the creation of one or more additional semiconductor devices on semiconductor substrate 100, and back-end of line (BEOL) processes for semiconductor devices and wafer processing can occur in various embodiments.

Figure 7:
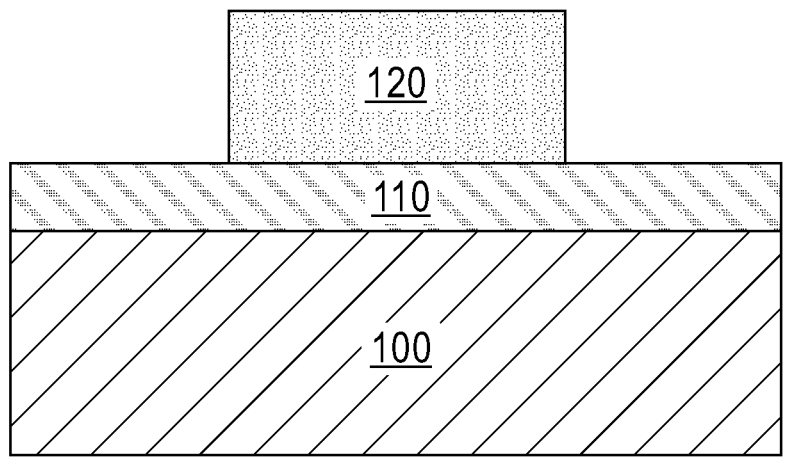
FIG. 7 depicts a cross-sectional view of a semiconductor substrate after fabrication steps to form a gate on a dielectric layer in accordance with an embodiment of the present invention.

FIG. 7 depicts a cross-sectional view of semiconductor substrate 100 after fabrication steps to form gate 120 on dielectric layer 110 in accordance with an embodiment of the present invention. In a second embodiment of the present invention, the fabrication process on semiconductor substrate 100 as depicted in FIG. 7 includes dielectric layer 110 on semiconductor substrate 100 with gate 120 formed on dielectric layer 110.

Figure 8:
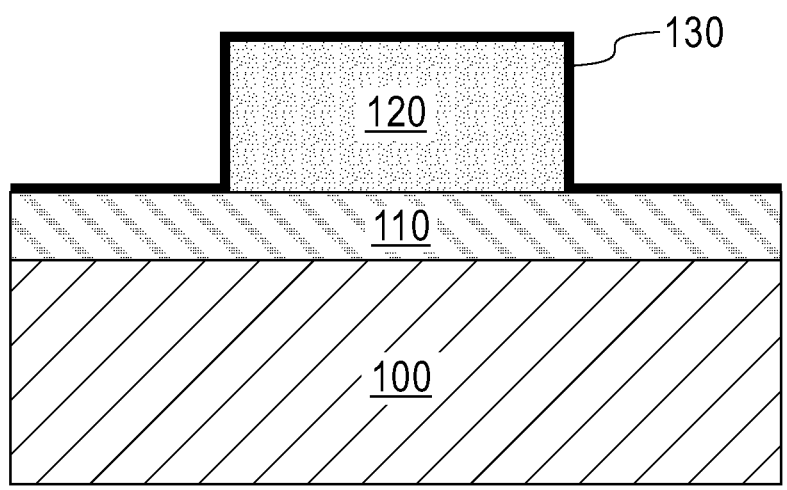
FIG. 8 depicts a cross-sectional view of the semiconductor substrate after fabrication steps to deposit a layer of graphene by a graphene transfer process on the gate and on a portion of a top surface of the high k dielectric material with an embodiment of the present invention.

FIG. 8 depicts a cross-sectional view of semiconductor substrate 100 after fabrication steps to deposit graphene layer 130A on gate 120 and the surface of dielectric layer 110 in accordance with an embodiment of the present invention. Graphene layer 130A, deposited by a graphene transfer method, provides a chemically inert surface and completely covers exposed surfaces of gate 120 and dielectric layer 110. In an embodiment, graphene layer 130A is transferred to gate 120 and a portion of dielectric layer 110 in the area surrounding or adjacent to gate 120. For example, graphene layer 130A is transferred to an area 0.5 nm to 100.0 nm from gate 120

Graphene layer 130A can be deposited by any of known graphene transfer methods. For example, graphene transfer processes include a deposit of a layer or several layers of graphene by CVD on a growth substrate such as a catalytic metal to form graphene layer 130A. Examples of growth substrates include but are not limited copper foils, copper, nickel foils, and other similar metals. The deposited layer or layers of graphene will become graphene layer 130A upon completion of a graphene transfer process to the surface of gate 120 and dielectric layer 110. For example, one or more layers of graphene can be deposited on the growth substrate. In an embodiment, a multi-layer deposition of graphene layer 130 may have some amorphous or disorganized carbon phases while still providing a continuous or complete coverage of gate 120. In an embodiment, graphene layer 130 includes substitutional atoms or molecules where carbon atoms are replaced by another type of atom or maybe an atom between layers of graphene.

In an example of a graphene transfer process, graphene layer 130A can be deposited on a growth substrate such as a copper foil and attached to an adhesive or carrier material such as a poly methyl methacrylate adhesive, a laser abatable adhesive, or UV releasable adhesive deposited as a carrier film for graphene layer 130A by spin coating, evaporation, or chemical solution deposition. In various embodiments, the growth substrate is removed. For example, the growth substrate can be removed by chemical or other etching process, a planarization process such as chemical mechanical polishing, or laser ablation. Graphene layer 130A on the carrier film, which is flexible enough to allow conformability of graphene layer 130A to features on semiconductor substrate 100 such as gate 120 and dielectric layer 110, is deposited on gate 120 and dielectric layer 110. A wet or dry etch process, for example, removes the carrier film.

In another example, graphene transfer processes then include attaching graphene layer 130A deposited by CVD on a growth substrate to one of: a stamp or to a self-adhesive layer attached to a stamp. The graphene transfer processes then include removing the growth substrate using chemical dissolution (e.g., by acids or similar chemicals) of the growth substrate and mechanically separating the stamp from graphene layer 130A such as the use of stamp, a self-release film, or a carrier can be used to a layer of CVD deposited graphene.

Figure 9:
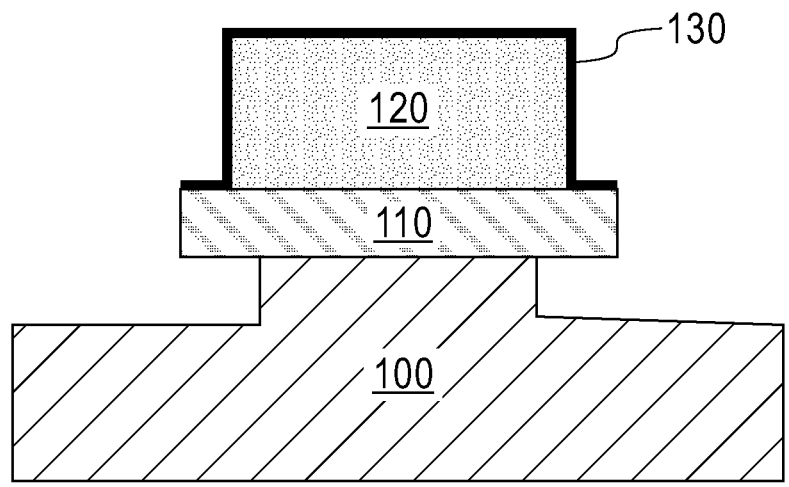
FIG. 9 depicts a cross-sectional view of the semiconductor substrate after fabrication steps to etch a portion of the graphene layer, a portion of the dielectric layer and a portion of the semiconductor layer in accordance with an embodiment of the present invention.

FIG. 9 depicts a cross-sectional view of the semiconductor substrate 100 after fabrication steps to etch a portion of graphene layer 130A, a portion of dielectric layer 110 and a portion of semiconductor substrate 100 in accordance with an embodiment of the present invention. One or more known wet or dry etch processes can be used to selectively remove portions of graphene layer 130A, dielectric layer 110, and semiconductor substrate 100, as depicted in FIG. 9.

In various embodiments, an etching process removes a portion of graphene layer 130A on dielectric layer 110. For example, a portion of graphene layer 130A on dielectric layer 110 is removed using an oxygen plasma etch or other type of etch process capable of removing graphene layer 130A. Selective etching of graphene layer 130A results in a portion of graphene layer 130A remaining over gate 120 and a small or narrow portion of graphene layer 130A remaining on dielectric layer 110 adjacent to gate 120. For example, a small portion of graphene layer 130A such as 2 nm to 200 nm may remain on dielectric layer 110 adjacent to gate 120 after completion of graphene layer 130A etch.

In various embodiments, one or more etching processes can be used to remove a portion of dielectric layer 110 and partially remove a top portion of semiconductor substrate 100 not under graphene layer 130A. The one or more etching processes maybe a single etch process or a combination of etch processes (e.g., one or more wet etches or dry etches). In an embodiment, one or more wet etching processes are used after the selective removal of a portion of graphene layer 130A to remove a portion of dielectric layer 110 and partially remove a top portion of semiconductor substrate 100. For example, a chemical etch of dielectric layer 110 occurs followed by a chemical etch of semiconductor substrate 100 using known etchants for dielectric layer 110 and known etchants for semiconductor substrate 100, respectively. After etching, a portion of semiconductor substrate 100 under the removed top portion of semiconductor substrate 100 remains under the portion of dielectric layer 110 remaining under gate 120. In an embodiment, a single etchant process removes the portion of dielectric layer 110 adjacent to gate 120 and a top portion of semiconductor substrate 100 under the removed portion of dielectric layer 110.

In various embodiments, a single etchant process or multiple etch processes for the removal of the portion dielectric layer 110 and the removal of the portion of semiconductor substrate 100 results in an undercut of semiconductor substrate 100 with respect to the remaining portion of dielectric layer 110 and gate 120. An undercut of semiconductor substrate 100 occurs when a larger portion of semiconductor substrate 100 is removed than the portion of dielectric layer 110 removed and when the remaining portion of semiconductor substrate 100 after etching of semiconductor substrate 100 is less wide than gate 120. The resulting structure after etching of dielectric layer 110 and semiconductor substrate 100 creates an undercut or a narrower area of semiconductor substrate 100 under a wider remaining portion of dielectric layer 110, gate 120, and graphene layer 130A. Therefore, in various embodiments, the undercut of semiconductor substrate 100 results in a remaining portion of semiconductor substrate 100 that is slightly less wide than gate 120. For example, an undercut of semiconductor substrate 100, where the width of substrate 100 under gate 120 is less than the width of gate 120, is in the range of 2 nm to 200 nm. The undercut of semiconductor substrate 100 in a semiconductor device such as a MOSFET provides an ability to overlap an area of the source and drain, formed in later steps, with a gate controlled area of semiconductor substrate 100 for improved electrical performance of the resulting MOSFET.

In an embodiment, a single etch process removes a portion of graphene layer 130A, a portion of dielectric layer 110 and a portion of semiconductor substrate 100. For example, a single wet or dry etch process removes the portion of graphene layer 130A on a portion of dielectric layer 110, the portion of dielectric layer 110 under the removed portion of graphene layer 130A, and the portion of semiconductor substrate 100 under the removed dielectric layer 110.

Figure 10:
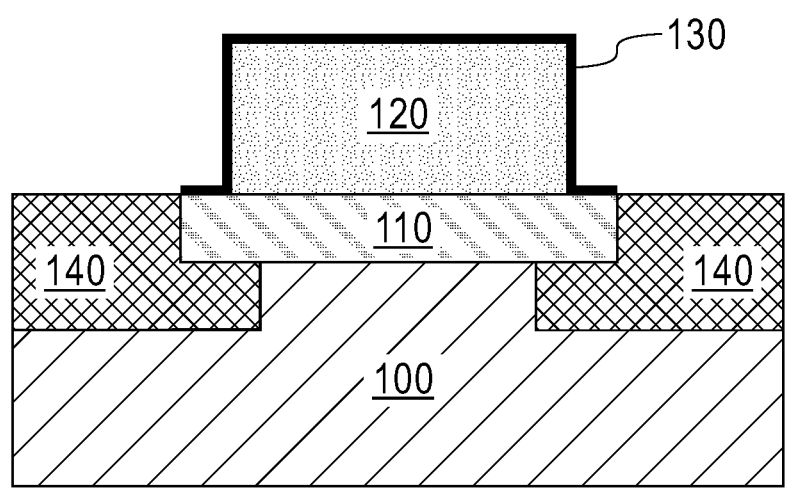
FIG. 10 depicts a cross-sectional view of the semiconductor substrate after fabrication steps for a self-aligned atomic layer deposition of a doped aluminum oxide layer for a semiconductor device source and drain in accordance with an embodiment of the present invention.
Figure 11:
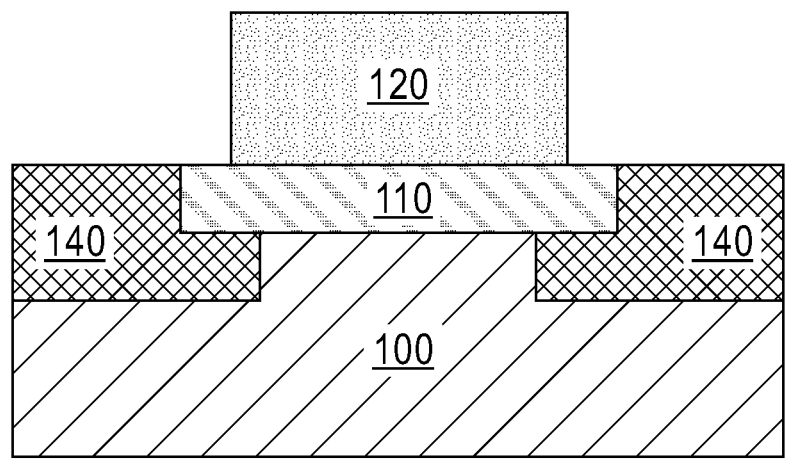
FIG. 11 depicts a cross-sectional view of the semiconductor substrate after fabrication steps to remove the graphene layer from the gate and the portion of the dielectric layer in accordance with an embodiment of the present invention.

FIG. 10 depicts a cross-sectional view of semiconductor substrate 100 after fabrication steps for a self-aligned deposit of source/drain material 140 in accordance with an embodiment of the present invention. In various embodiments, graphene layer 130A is used a deposition mask for a self-aligned deposition of source/drain material 140. Graphene layer 130A provides a chemically inert surface that prevents a deposition of materials such as source/drain material 140 on the surface of graphene layer 130A. For example, graphene layer 130A prevents deposition of source/drain material 140 such as AZO by ALD on gate 120 and on the top surface the small remaining portion of dielectric layer 110 extending beyond gate 120 covered by graphene layer 130A.

Source/drain material 140 does not deposit on graphene layer 130A during atomic layer deposition thus, providing a self-aligned deposit of source/drain material 140. As previously discussed, graphene layer 130A provides a chemically inert surface preventing nucleation of ALD films or ALD material deposition on graphene layer 130A. In various embodiments, source/drain material 140 is deposited in the area created by the removal if the portion of dielectric layer 110 and the removal of the portion of semiconductor substrate 100 as discussed in previous steps with respect to FIG. 9. As depicted in FIG. 10, source/drain material 140 deposits over a portion of semiconductor substrate 100 not under dielectric layer 110, under dielectric layer 110, and up a vertical surface or edge of dielectric layer 110 not covered by graphene layer 130A. For example, source/drain material 140 deposited by ALD is deposited to a height corresponding to or approximately level with the remaining portion or the edge of graphene layer 130A. Source/drain material 140 deposition thickness can be in a range of 2 nm to 200 nm although the thickness of source/drain material 140 is not limited to this range In an embodiment, source/drain material 140 deposits up only a portion of the vertical edge of the remaining portion of dielectric layer 110. For example, source/drain material 140 is deposited by a self-aligned atomic layer deposition to a desired thickness or height above the surface of semiconductor substrate 100 in the region or recessed area where the portion of semiconductor substrate 100 has been removed (e.g., in the previous steps associated with FIG. 9). A desired thickness or a desired range of thickness of as deposited source/drain material 140 can be determined prior to fabrication based, at least in part, on a desired electrical performance of the semiconductor device or MOSFET.

In some embodiments, semiconductor substrate 100 upon completion of processing (MOSFET device completion, BEOL process completion, and/or completion of any additional devices, etc.) may be diced in semiconductor chip form. The resulting semiconductor chips can be distributed by the fabricator in raw wafer form (that is, as a single wafer that has multiple unpackaged chips), as a bare die or in a packaged form. In the latter case, the chip is mounted in a single chip package (such as a plastic carrier, with lead that is affixed to a motherboard or other higher level carrier) or in a multichip package (such as a ceramic carrier that has either or both surface interconnections or buried interconnections). In any case, the chip is then integrated with other chips, discreet circuit elements, a motherboard or an end product. The end product can be any product that includes integrated circuit chips, ranging from toys and other low-end applications to advanced computer products having a display, a keyboard or other input device and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

The invention claimed is:

1. A method of fabricating a semiconductor device, comprising:
   transferring a layer of graphene to a surface of a dielectric layer on a semiconductor substrate and a gate formed on the dielectric layer;
   removing a portion of the layer of graphene on the dielectric layer, wherein the portion of the layer of graphene removed is not adjacent to the gate;
   removing a portion of the dielectric layer and partially removing a top portion of the semiconductor substrate not covered by the portion of the layer of graphene remaining;
   depositing, by a self-aligning deposition process, a layer of a material, wherein the layer of the material creates a source and a drain in a semiconductor device; and
   removing the layer of graphene from the gate and from a portion of the dielectric layer remaining adjacent to the gate.

2. The method of claim 1, wherein the layer of graphene transferred is one of a single molecular layer of carbon atoms or a plurality of molecular layers of carbon atoms.

3. The method of claim 1, wherein removing the portion of the dielectric layer and partially removing the top portion of the semiconductor substrate not covered by the portion of the layer of graphene remaining includes removing a portion of the semiconductor substrate from under the portion of the dielectric layer being removed and from under a portion of the dielectric layer remaining under the gate to create an undercut of the semiconductor substrate with respect to the gate.

4. The method of claim 1, wherein depositing, by a self-aligning deposition process, the layer of a material creating the source and the drain in the semiconductor device includes creating an overlap region in the source and the drain and a gate controlled region of the semiconductor substrate.

5. The method of claim 3, wherein removing a portion of the layer of graphene on the dielectric layer not adjacent to the gate includes removing the portion of the layer of graphene that is at least 2 nm from an edge of the gate.

6. The method of claim 1, wherein the semiconductor substrate is a group III-V semiconductor material and the layer of the material creating the source and the drain is composed of aluminum doped zinc oxide.

7. The method of claim 1, wherein the layer of the material that creates a source and a drain in the semiconductor device is deposited by an atomic layer deposition.

* * * * *